(12) United States Patent
Mackey et al.

(10) Patent No.: US 6,812,789 B2
(45) Date of Patent: Nov. 2, 2004

(54) RF POWER AMPLIFIER DIGITAL GAIN FLATTENING OVER MULTIBAND FREQUENCIES

(75) Inventors: Christopher David Mackey, Spencerport, NY (US); Brian Christopher Boorman, Honeoye, NY (US); Thomas Daniel O Brien, Honeoye Falls, NY (US)

(73) Assignee: Harris Corporation, Melbourne, FL (US)

( * ) Notice: Subject to any disclaimer, the term of this patent is extended or adjusted under 35 U.S.C. 154(b) by 8 days.

(21) Appl. No.: 10/197,431

(22) Filed: Jul. 18, 2002

(65) Prior Publication Data

US 2004/0012441 A1 Jan. 22, 2004

(51) Int. Cl.[7] .............................................. H03G 3/20
(52) U.S. Cl. ...................................... 330/129; 330/132
(58) Field of Search ................................ 330/129, 132, 330/136, 127, 138

(56) References Cited

U.S. PATENT DOCUMENTS

| | | | |
|---|---|---|---|
| 4,794,343 A | * 12/1988 | Yang | ............................. 330/2 |
| 5,293,325 A | * 3/1994 | Roos | ............................. 702/89 |
| 6,226,794 B1 | * 5/2001 | Anderson et al. | ............ 725/131 |
| 6,420,934 B1 | * 7/2002 | Butler et al. | ................. 330/279 |
| 2002/0158688 A1 | * 10/2002 | Terosky et al. | .............. 330/129 |

* cited by examiner

Primary Examiner—Timothy P. Callahan
Assistant Examiner—Linh M. Nguyen
(74) Attorney, Agent, or Firm—Duane Morris LLP

(57) ABSTRACT

A method and apparatus for maintaining approximately constant gain of an RF power amplifier includes a digital control module for modifying gain parameters of the power amplifier to provide a constant fixed power gain over the entire frequency range of operation. The digital control module compares stored frequency response parameters, which are indicative of the inherent closed-loop gain of the power amplifier, with the current selected gain and carrier frequency setting to generate a digital gain control value. The digital gain control value is used to modify a detected input RF envelope in the power amplifier analog loop. The modified input envelope is compared with an envelope of the transmitted RF signal to adjust the gain of the power amplifier. Optionally, the detected RF input envelope may be sampled to digitally compensate for variations in the RF input signal.

18 Claims, 3 Drawing Sheets

RF POWER AMPLIFIER DIGITAL GAIN FLATTENING OVER MULTIBAND FREQUENCIES

BACKGROUND OF THE INVENTION

The present invention relates generally to radio communications systems, and more specifically to 50-Watt radio frequency (RF) power amplifier systems used in military vehicle applications.

Constant gain (i.e., output power with respect to input power) in radio frequency (RF) communications is typically difficult to obtain because of several factors, including the wide frequency range (bandwidth) of the transmitted RF signals, effects (e.g., parasitic inductance, parasitic capacitance) of electronic components in the transmitter and amplifier portions of the communication system, temperature variations, shifts in tolerances, changes in the transmission medium, and device limitations, for example. Attempts to achieve constant gain have included complicated adaptive techniques, which are often difficult to calibrate and typically not robust over a wide range of conditions. An improved scheme for achieving constant gain, over a range of frequencies is desired.

In one embodiment, an apparatus for maintaining approximately constant gain of an output signal with respect to an input signal for an amplifier includes a digital control module. The digital control module is configured to determine a digital gain control value. The digital gain control value is determined in accordance with a selected frequency indicative of a carrier frequency of the output signal; a selected gain value indicative of a gain of the output signal with respect to the input signal; and predetermined calibration values indicative of an inherent closed-loop gain as a function of frequency of the amplifier. Parameters of the amplifier are adjusted in response to the digital gain control value to obtain approximately constant gain.

In another embodiment, a method for maintaining approximately constant gain of an output signal with respect to an input signal for an amplifier includes determining a digital gain control value and adjusting parameters of the amplifier responsive to the digital gain control value to obtain the approximately constant gain. The digital gain control value is determined in accordance with a selected frequency indicative of a carrier frequency of the output signal, a selected gain value indicative of a gain of said output signal with respect to the input signal, and predetermined calibration values indicative of an inherent closed-loop gain as a function of frequency of the amplifier.

DETAILED DESCRIPTION

An apparatus for maintaining approximately constant gain of an output signal with respect to an input signal as described herein is configured to maintain approximately constant gain regardless of variations in apparatus and environmental parameters. The apparatus includes a digital control module for modifying gain parameters of a power amplifier to provide a constant fixed power gain over the entire frequency range of operation. The digital control module compares stored frequency response parameters (also referred to as calibration values herein) with the current selected gain and carrier frequency setting to generate a digital gain control value. The digital gain control value is used to modify a detected input radio frequency (RF) envelope in the power amplifier analog loop. The input envelope is compared with an envelope of the transmitted RF signal (output signal) to adjust the gain of the power amplifier. In one embodiment, the apparatus comprises a field-programmable gate array (FPGA), which uses the currently selected frequency to obtain, from storage, the deviation needed to flatten the gain of the power amplifier at that frequency.

Figure 1:
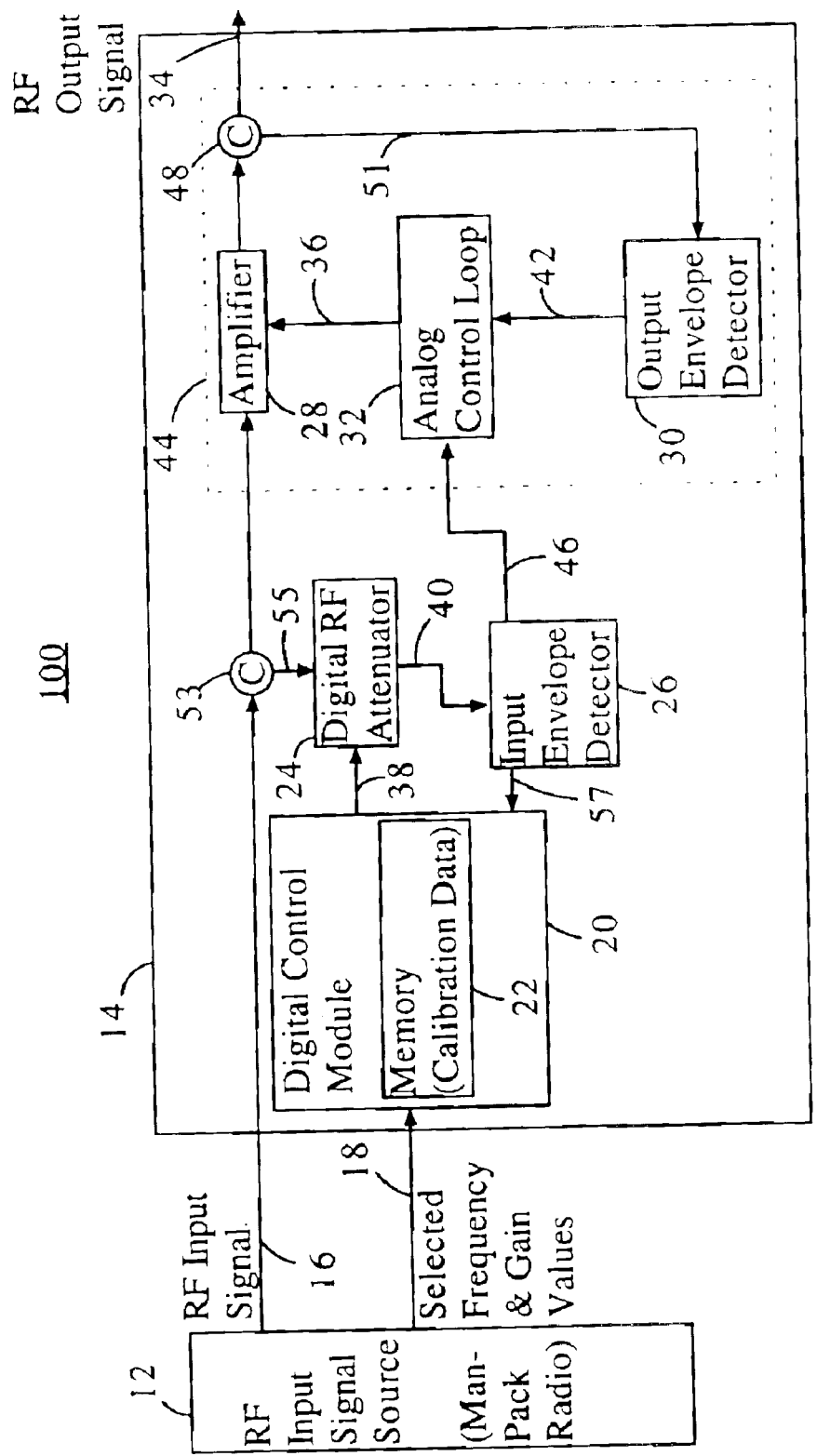
FIG. 1 is a functional block diagram of an embodiment of an apparatus for maintaining approximately constant gain in accordance with an embodiment of the present invention.

FIG. 1 is a functional block diagram of an apparatus 100 for maintaining approximately constant gain of output signal 34 with respect to input signal 16. The apparatus 100 is configured to adjust the gain parameters of the amplifier 28 to provide a constant fixed power gain over the entire frequency of operation of the apparatus 100. The amplifier 28 may be, for example, a 50-Watt RF power amplifier. The entire frequency range of operation may be a transmitted (RF output signal 34) frequency range of 30 MHz to 512 MHz, inclusive, for example. Due to the wide range of operating frequencies and the various effects on power amplifiers, it is not uncommon for the gain versus frequency of the transmitted output signal with respect to the input signal to fluctuate. To compensate for this fluctuation and obtain approximately constant gain, the fluctuations in gain associated with the power amplifier are determined and utilized by digital circuitry to compensate for the fluctuations.

In one embodiment, the gain of the output signal 34 with respect to input signal 16 is approximately constant regardless of variations in parameters directly associated with apparatus 100 (e.g., parasitic inductance and/or parasitic capacitance of electronic components, temperature variations, shifts in tolerances, and device limitations) and/or variations of parameters not directly associated apparatus 100 (e.g., environmental parameters). Generally, approximately constant gain is maintained via feedback loop 44 responsive to input envelope signal 46. It is to be understood that although the apparatus 100 and method for providing approximately constant gain of an output signal 34 with respect to input signal 16 are described herein with respect to radio frequency (RF) signals, the use of RF signals is exemplary and other types of signals are envisioned. Other types of signals include electromagnetic signals having different frequency ranges (e.g., HF, VHF, UHF, and microwave signals), and acoustic signals (e.g., audio signals and ultrasonic signals), for example.

The apparatus 100 comprises an RF power amplifier portion 14 configured to receive an RF input signal 16 and configured to receive a signal 18 corresponding to selected frequency and gain values. The power amplifier portion 14 processes signals 16 and 18 to provide the RF output signal 34. The gain of the RF output signal 34 with respect to the RF input signal 16 is automatically maintained to be approximately constant. The apparatus 100 may also include the source 12 of the RF input signal 16. RF input signal source 12 may comprise any appropriate source capable of providing the RF signal 16 and capable of providing a signal 18, having values indicative of the selected carrier frequency and selected gain. Examples of appropriate RF input signal sources include military radios capable of being carried by a single person (referred to as man-pack radios), such as the RT-1796(P)/PRC, the RT-1694D(P)/PRC, the PRC-4620 VHF/FM, the VX 120-HF, and the RF-5800U UHF, for example. In operation, a user/operator of the signal source 12 selects the desired carrier frequency of the RF input signal 16 (which is typically the same carrier frequency of the RF output signal 34, however this is not required), and selects the desired gain of the RF output signal 34 with respect to the RF input signal 16.

The apparatus 100 also comprises a digital control module 20 configured to receive the selected frequency and gain values provided by the signal 18 and process signal 18 utilizing data stored in memory 22 to generate a digital gain control value. The digital gain control value is provided to the digital RF attenuator 24 via the signal 38. The digital RF attenuator 24 is configured to receive the input RF signal 16, via the coupler 53 and the coupled input RF signal 55, and attenuate the coupled input RF signal 55 responsive to the received digital gain control value received via the signal 38. The digital RF attenuator 24 provides the attenuated input RF signal to the input envelope detector 26 via the signal 40. The input envelope detector 26 generates an envelope of the attenuated input RF signal and provides the input envelope to the analog control loop 32 via signal 46. Optionally, the input envelope is also provided to the digital control module 20 via signal 57 to allow compensation of the variations in power of the input signal 16. Concurrently, the output RF signal 34 is provided to the output envelope detector 30 via coupler 48 and the signal 51. The output envelope detector 30 generates an envelope of the output RF signal 34 and provides the output envelope to the analog control loop 32 via signal 42. The input envelope and the output envelope provided by signals 46 and 42, respectively, are compared by the analog control loop 32, and a comparison signal 36 is provided to the amplifier 28 to adjust the gain of the amplifier 28 to be approximately constant.

In operation, the digital control module 20 receives the selected frequency value (indicative of the desired carrier frequency of output signal 34) and the selected gain value (indicative of the desired gain of output signal 34 with respect to input signal 16) via signal 18. The selected frequency and gain values are used to select a deviation value from the data stored in the memory portion 22. The deviation values, also referred to as calibration data, are indicative of the inherent closed-loop gain (i.e., gain without frequency compensation) of the power amplifier 14 as a function of frequency. The calibration data may be obtained by providing input signal 16 at predetermined frequencies to the power amplifier portion 14 and determining the gain of the output signal 34 with respect to the input signal 16 for each of the predetermined frequencies. This frequency response information may be used to determine the amount of attenuation to be used to attenuate the input signal 16 to obtain the desired gain of the output signal 34 with respect to the input signal 16. In one embodiment, the calibration data is configured as a table of correction data or deviation values from a predetermined gain value, stored in the memory portion 22 of the digital control module 20. For example, each deviation value may represent the difference, in dB, to be subtracted from the amplitude of the input signal 16. The digital control module 20 selects the deviation value from the memory portion 22 that corresponds to the selected frequency and gain value. The selected deviation value is utilized to generate a digital control value, which is provided to the digital RF attenuator 24 via the digital control signal 38. In an exemplary embodiment, the digital control module 20 is implemented as a field-programmable gate array (FPGA) having the memory portion 22.

A portion of the input signal 16 is provided to the digital RF attenuator 24 via the coupler 53. The coupler 53 may comprise any appropriate coupling means, such as a dual direction coupler configured to separate transmitted signals and reflected signals. The digital RF attenuator 24 attenuates the amplitude of the coupled analog input signal 55 by an amount responsive to the digital control value received via the digital control signal 38. The analog attenuated input signal 40 is provided to the input envelope detector 26. The input envelope detector 26 generates the envelope of the amplitude of the attenuated input signal 40. The envelope of the attenuated input signal 40 may be generated by any appropriate envelope detection means, such as an envelope detector circuit. The envelope of the attenuated input signal 40 is provided to the analog control loop 32 via the analog input envelope signal 46. Optionally, the envelope of the attenuated input signal 40 is provided to the digital control module 20 via the analog input envelope signal 57. A portion of the output signal 34 is provided by the coupler 48 to the output envelope detector 30. The coupler 48 may comprise any appropriate coupling means, such as a dual direction coupler configured to separate transmitted signals and reflected signals. The output envelope detector 30 generates the envelope of the amplitude of the output signal 34. The envelope of the output signal 34 may be generated by any appropriate envelope detection means, such as an envelope detector circuit. The envelope of the amplitude of the output signal 34 is provided to the analog control loop 32 via the analog output envelope signal 42. The analog control loop 32 compares the input envelope signal 46 with the output envelope signal 42 to generate the analog comparison signal 36. Comparison of the input envelope signal 46 with the output envelope signal 42 may be accomplished by any appropriate means, such as a comparator circuit for example. The comparison signal 36 adjust parameters of the amplifier 28 to maintain approximately constant gain of the output signal 34 with respect to the input signal 16. Any appropriate amplifier 28 parameters may be adjusted. For example, bias resistance values of the amplifier 28 may be adjusted in response to the comparison signal 36. In one embodiment, variations in the drive power level of the RF input signal 16 may be compensated for dynamically by the digital control module 20. The attenuated input envelope signal 57 may be sampled and filtered to determine an average power level of the input signal 16. The digital control module 20 may then dynamically adjust for such variations by modifying the digital control signal 38. It is to be understood that the digital control module 20 takes into account the amount of attenuation added by the digital RF attenuator 24 and adjusts the sampled envelope signal 57 accordingly.

Figure 2A:
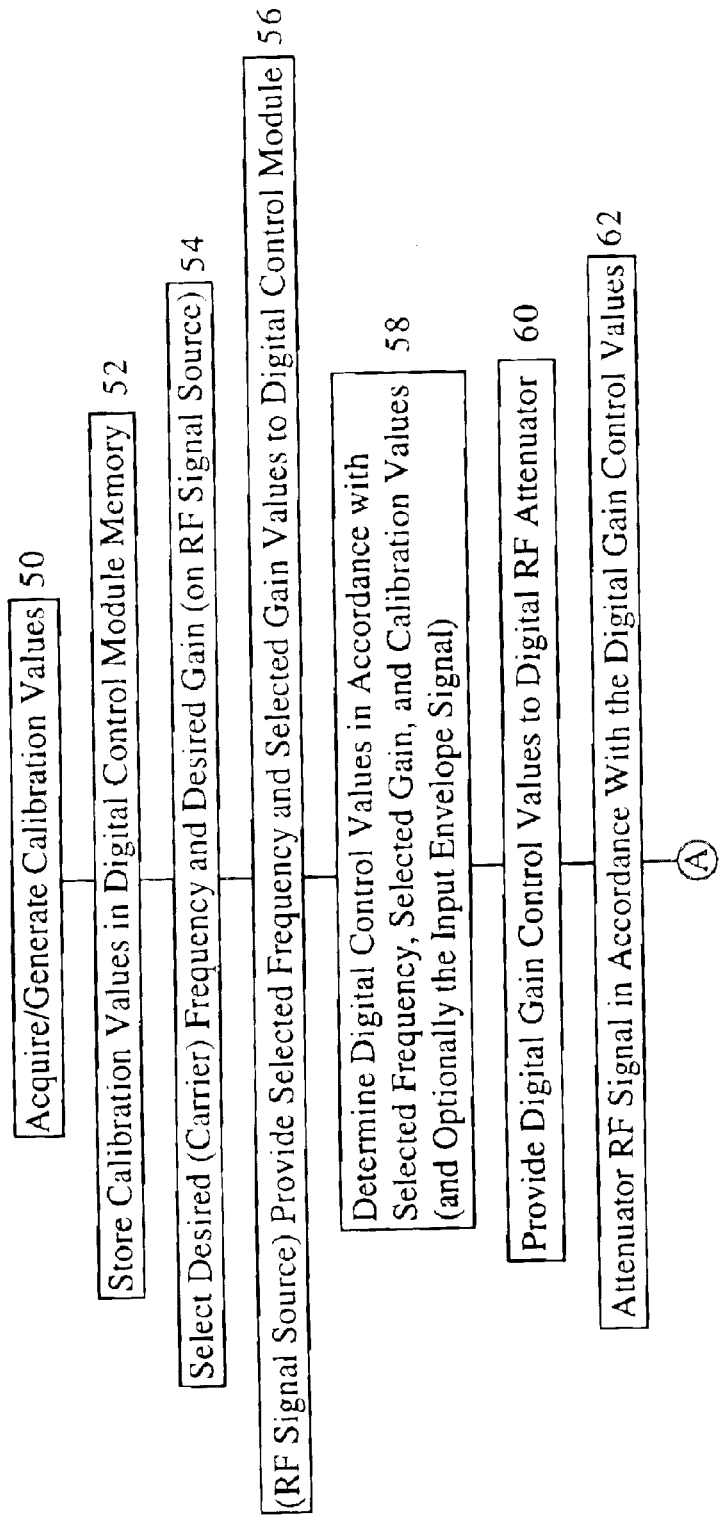
FIG. 2A is a flow diagram of an exemplary process for maintaining approximately constant gain in accordance with an embodiment of the present invention.
Figure 2B:
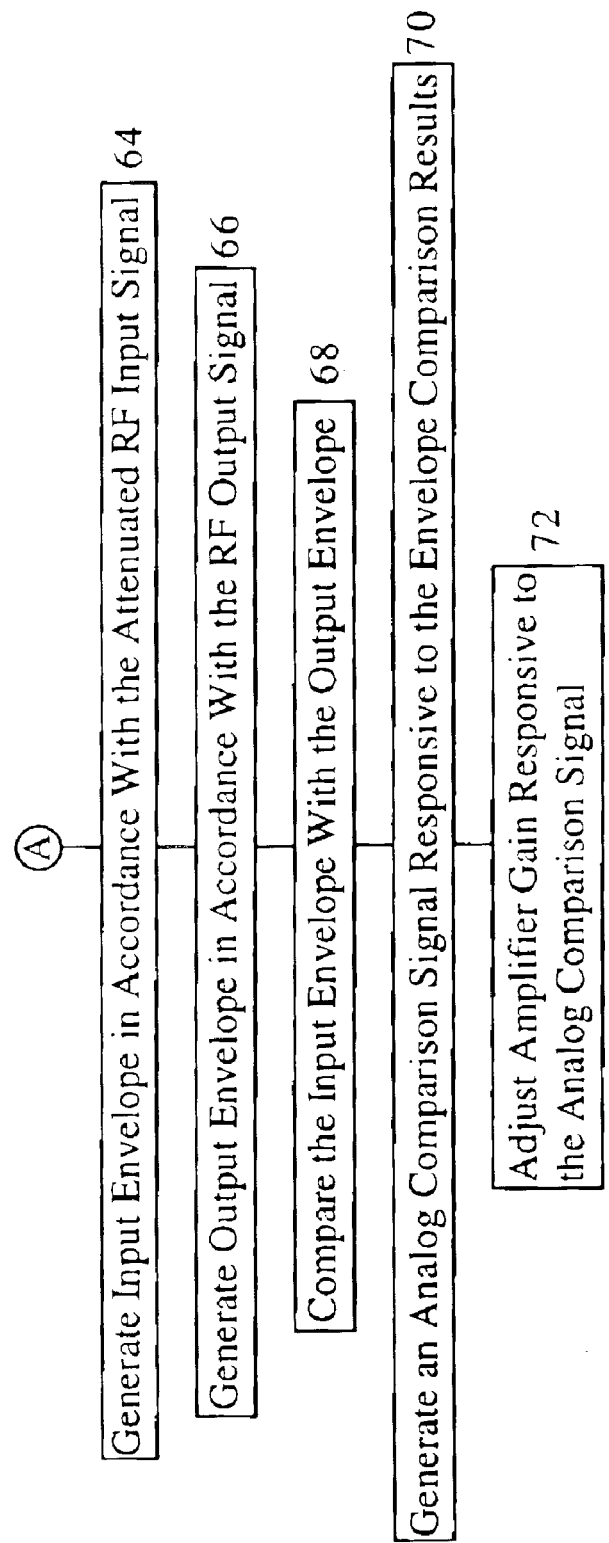
FIG. 2B is a continuation of FIG. 2A.

FIGS. 2A and 2B show a flow diagram of an exemplary process for maintaining approximately constant gain of the output signal of a power amplifier with respect to the input signal of the power amplifier, in accordance with the present invention. The process depicted in FIGS. 2A and 2B are described herein with respect to the apparatus 100 depicted in FIG. 1. It is to be understood that the process depicted in FIGS. 2A and 2B are not limited to implementation utilizing the apparatus 100. Other functional implementations are envisioned. Referring to FIG. 2A, the fluctuations associated with the gain of the power amplifier 14 are acquired and the calibration data is generated at step 50. The calibration (deviation) data are stored in the memory portion 22 of the digital control module 20 at step 52. In one embodiment, the calibration data are store in the memory portion 22 of the digital control module 20 in the form of a data table comprising deviation values as a function of frequency and gain. A desired frequency (indicative of the desired carrier frequency of the output signal 34) and a desired gain (indicative of the desired gain of the output signal 34 with respect to the input signal 16) are selected at step 54. In one embodiment, this selection is accomplished via the signal source 12. In other embodiments, selected frequency and gain values may be stored in the digital control module and utilized to control the gain, unless new selected frequency and gain values are entered. The selected values of frequency and gain are provided to the digital control module 20 at step 56. The digital control module 20 utilizes the selected frequency value, the selected gain value, and optionally the input envelope signal 57, to obtain the appropriate deviation value from the memory portion 22 and generates a digital control value at step 58. The digital control value is provided to the digital RF attenuator 24 via digital control signal 38 at step 60. The digital RF attenuator 24 attenuates the analog input signal 16 in response to the digital control signal 38 at step 62.

Referring to FIG. 2B, which is a continuation of FIG. 2A, the envelope of the amplitude of the attenuated input signal 40 is generated by the input envelope detector 26 at step 64. The envelope of the amplitude of the output signal 34 is generated by the output envelope detector 30 at step 66. The input envelope is compared with output envelope by the analog control loop 32 at step 68. The analog control loop 32 generates the comparison signal 36 and step 70. The amplifier 28 is adjusted in response to the comparison signal 36 to achieve approximately constant gain of the output signal 34 with respect to the input signal 16 at step 72.

Although the apparatus and method for maintaining approximately constant gain has been described in terms of exemplary embodiments, it is not limited thereto. Rather, the appended claims should be construed broadly to include other variants and embodiments of the invention, which may be made by those skilled in the art without departing from the scope and range of equivalents of the invention.

What is claimed is:

1. A method for maintaining approximately constant gain of an output signal with respect to an input signal for an amplifier, said method comprising:

determining a digital gain control value in accordance with:

a selected frequency indicative of a carrier frequency of said output signal;

a selected gain value indicative of a gain of said output signal with respect to said input signal; and predetermined calibration values indicative of an inherent closed-loop gain as a function of frequency of said amplifier; and adjusting parameters of said amplifier responsive to said digital gain control value to obtain said approximately constant gain.

2. A method in accordance with claim 1, further comprising:

attenuating said input signal responsive to said digital gain control value for providing an attenuated input signal, wherein said input signal and said attenuated input signal are analog signals.

3. A method in accordance with claim 2, further comprising:

generating an envelope of an amplitude of said attenuated input signal for providing an input envelope signal; and
   generating an envelope of an amplitude of said output signal for providing an output envelope signal.

4. A method in accordance with claim 3, further comprising:

comparing said input envelope signal with said output envelope signal for providing a comparison signal; and
   adjusting said parameters of said amplifier responsive to said comparison signal.

5. A method in accordance with claim 3, wherein said digital control value is determined further in accordance with said input envelope signal.

6. A method in accordance with claim 1, further comprising:

providing a plurality of calibration signals each having a respective frequency to said amplifier;
   calculating gain values for each output signal with respect to each of said plurality of calibration signals; and
   generating said calibration values in accordance with a difference between said calculated gain values and a predetermined gain value.

7. A method in accordance with claim 1, wherein said input signal and said output signal are radio frequency (RE) signals.

8. An apparatus for maintaining approximately constant gain of an output signal with respect to an input signal for an amplifier, said apparatus comprising:

a digital control module configured to determine a digital gain control value in accordance with:

a selected frequency indicative of a carrier frequency of said output signal;

a selected gain value indicative of a gain of said output signal with respect to said input signal; and predetermined calibration values indicative of an inherent closed-loop gain as a function of frequency of said amplifier; and said amplifier, wherein parameters of said amplifier are adjusted in response to said digital gain control value to obtain said approximately constant gain.

9. An apparatus in accordance with claim 8, further comprising:

a digital attenuator configured to attenuate said input signal responsive to said digital gain control value and to provide an attenuated input signal, wherein said input signal and said attenuated input signal are analog signals.

10. An apparatus in accordance with claim 9, further comprising:

an input envelope detector configured to generate an envelope of an amplitude of said attenuated input signal and to provide an input envelope signal; and
    an output envelope detector configured to generate an envelope of an amplitude of said output signal and to provide an output envelope signal.

11. An apparatus in accordance with claim 10, wherein said digital control value is determined further in accordance with said input envelope signal.

12. An apparatus in accordance with claim 10, further comprising:

an analog control loop configured to compare said input envelope signal with said output envelope signal and to provide a comparison signal, wherein said parameters of said amplifier are adjusted responsive to said comparison signal.

13. An apparatus in accordance with claim 12, wherein said output envelope detector, said analog control loop, and said amplifier are configured as a feedback loop for adjusting said parameters of said amplifier.

14. An apparatus in accordance with claim 8, further comprising:

a signal source configured to provide said input signal and to provide said selected frequency and said selected gain value.

15. An apparatus in accordance with claim 8, wherein said input signal and said output signal are radio frequency (RF) signals.

16. An apparatus in accordance with claim 8, wherein said digital control module comprises a field-programmable gate array (FPGA).

17. An apparatus in accordance with claim 8 wherein said approximately constant gain is maintained over an entire operational frequency range of said apparatus.

18. An apparatus in accordance with claim 17, wherein said operational frequency range comprises 30 MHz to 512 MHz, inclusive.

* * * * *